(12) United States Patent
Chiang et al.

(10) Patent No.: US 8,952,606 B2
(45) Date of Patent: Feb. 10, 2015

(54) PIXEL STRUCTURE

(71) Applicant: E Ink Holdings Inc., Hsinchu (TW)

(72) Inventors: Ming-Sheng Chiang, Hsinchu (TW); Chih-Cheng Wang, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 0 days.

(21) Appl. No.: 14/055,878

(22) Filed: Oct. 16, 2013

(65) Prior Publication Data

US 2014/0191649 A1 Jul. 10, 2014

(30) Foreign Application Priority Data

Jan. 4, 2013 (TW) .............................. 102100299 U

(51) Int. Cl.
F21V 15/04 (2006.01)
H05K 1/00 (2006.01)

(52) U.S. Cl.
CPC ........................................ *H05K 1/00* (2013.01)
USPC ......................................................... 313/498

(58) Field of Classification Search
USPC ......... 313/240, 498–511; 257/40, 98; 445/24, 445/25
See application file for complete search history.

(56) References Cited

U.S. PATENT DOCUMENTS

| | | | |
|---|---|---|---|
| 5,748,266 A | 5/1998 | Kodate | |
| 5,757,451 A | 5/1998 | Miyazaki et al. | |
| 6,424,402 B1 | 7/2002 | Kishimoto | |
| 7,557,896 B2 | 7/2009 | Wu et al. | |
| 7,940,360 B2 | 5/2011 | Ishitani | |
| 7,969,546 B2 | 6/2011 | Wu et al. | |
| 8,102,498 B2 | 1/2012 | Kanaya et al. | |
| 2009/0015760 A1* | 1/2009 | Hattori et al. | 349/93 |
| 2011/0025612 A1* | 2/2011 | Shiau | 345/173 |
| 2011/0205475 A1 | 8/2011 | Ishitani | |
| 2012/0268386 A1* | 10/2012 | Karamath et al. | 345/173 |
| 2013/0242242 A1* | 9/2013 | Saida | 349/113 |
| 2014/0008655 A1* | 1/2014 | Chen et al. | 257/59 |
| 2014/0014944 A1* | 1/2014 | Chen et al. | 257/43 |
| 2014/0134763 A1* | 5/2014 | Park et al. | 438/26 |
| 2014/0159046 A1* | 6/2014 | Deng et al. | 257/72 |

* cited by examiner

Primary Examiner — Tracie Y Green
(74) Attorney, Agent, or Firm — Jiang Chyun IP Office

(57) ABSTRACT

A pixel structure including a flexible substrate, an active device, a pixel electrode, a capacitance electrode, a first insulation layer, a second insulation layer, and a padding layer is provided. The pixel electrode is electrically connected to the active device and has pixel electrode openings. The capacitance electrode is disposed overlapping the pixel electrode and has capacitance electrode openings corresponding to the pixel electrode openings. The first insulation layer is disposed between the pixel electrode and the flexible substrate. The second insulation layer is disposed between the pixel electrode and the capacitance electrode. The active device is disposed between the second insulation layer and the flexible substrate. The padding layer includes padding pillars and a padding pattern covering over the active device. The padding pillars are located in the pixel electrode openings respectively. The pixel electrode partially covers the padding pattern and exposes the padding pillars.

12 Claims, 6 Drawing Sheets

PIXEL STRUCTURE

CROSS-REFERENCE TO RELATED APPLICATION

This application claims the priority benefit of Taiwan application serial no. 102100299, filed on Jan. 4, 2013. The entirety of the above-mentioned patent application is hereby incorporated by reference herein and made a part of this specification.

BACKGROUND

1. Field of the Invention

The invention relates to a pixel structure, and more particularly, to a pixel structure disposed on a flexible substrate.

2. Description of Related Art

With rapid development of display technologies, the cathode ray tube (CRT) displays used earlier have been gradually replaced by the current flat panel displays (FPD). Compared with a rigid substrate (such as a glass substrate) used in the FPD, a flexible substrate (such as a plastic substrate) has characteristics including flexibility and impact resistance. Therefore, in recent years, it has been researched to manufacture pixel structures on the flexible substrate so as to form a flexible display.

Such flexible display requires to having good resistance against an external impact. However, in a drop ball test, it is often found that the current flexible display fails to pass the test because the pixel structure is cracked. This also means that this kind of products currently available is likely to be cracked and damaged under an external impact during the process of use. Therefore, it is necessary to improve the reliability in impact resistance of the current flexible products.

SUMMARY OF THE INVENTION

The invention provides a pixel structure which is disposed on a flexible substrate and has an ideal impact resistance.

The invention provides a pixel structure including a flexible substrate, an active device, a pixel electrode, a capacitance electrode, a first insulation layer, a second insulation layer, and a padding layer. The active device is disposed on the flexible substrate. The pixel electrode is disposed on the flexible substrate and electrically connected to the active device. The pixel electrode has a plurality of pixel electrode openings. The capacitance electrode is disposed on the flexible substrate and overlaps the pixel electrode. The capacitance electrode has a plurality of capacitance electrode openings corresponding to the pixel electrode openings The first insulation layer is disposed between the pixel electrode and the flexible substrate. The second insulation layer is disposed between the pixel electrode and the capacitance electrode. The active device is disposed between the second insulation layer and the flexible substrate. The padding layer is disposed on the flexible substrate. The padding layer includes a plurality of padding pillars and a padding pattern. The padding pattern covers the active device, and the padding pillars are located in the pixel electrode openings respectively. The pixel electrode partially covers the padding pattern and exposes the padding pillars.

According to an embodiment of the invention, the pixel structure further includes an auxiliary electrode. The auxiliary electrode is disposed between the flexible substrate and the pixel electrode and is electrically connected to the pixel electrode. The auxiliary electrode has a plurality of auxiliary electrode openings corresponding to the pixel electrode openings and the capacitance electrode openings. The capacitance electrode may be selectively located between the auxiliary electrode and the pixel electrode, and the first insulation layer is located between the auxiliary electrode and the capacitance electrode. The first insulation layer has a first contact opening, and the second insulation layer has a second contact opening. The first contact opening corresponds to the second contact opening, and the pixel electrode is connected to the auxiliary electrode through the first contact opening and the second contact opening. Alternatively, the auxiliary electrode is located between the capacitance electrode and the pixel electrode, and the first insulation layer is located between the auxiliary electrode and the capacitance electrode.

According to an embodiment of the invention, the second insulation layer has a contact opening, so that the pixel electrode is electrically connected to the active device through the contact opening.

According to an embodiment of the invention, the first insulation layer and the second insulation layer are located between the padding pillars and the flexible substrate.

According to an embodiment of the invention, the padding pattern surrounds the pixel electrode.

According to an embodiment of the invention, the active device includes a gate, a channel layer, a source and a drain. The channel layer is electrically insulated from the gate, and the source and the drain are connected to the channel layer. The gate is connected to a scan line. The source is connected to a data line. The drain is connected to the pixel electrode. The source, the drain and the capacitance electrode are all disposed between the first insulation layer and the second insulation layer. In addition, the gate is disposed between the first insulation layer and the flexible substrate. In an embodiment, the capacitance electrode is disposed between the first insulation layer and the flexible substrate.

Based on the above, the pixel structure of the invention disposes elements on a flexible substrate and thus has flexibility. In addition, the pixel structure of the embodiments of the invention is disposed with a plurality of padding pillars which do not overlap conductor electrodes. Therefore, when the pixel structure of the embodiments of the invention is under an external impact, the padding pillars are able to endure external force and transmit the external force to the flexible substrate, so that the conductor electrodes are not impacted by the external force and are unlikely to be damaged. In this way, the pixel structure of the embodiments of the invention is able to have an ideal impact resistance. The pixel structure of the embodiments of the invention is unlikely to be damaged during tests; in addition, the pixel structure of the embodiments of the invention is also unlikely to crack and has an ideal reliability when actually used.

In order to make the aforementioned features and advantages of the invention more comprehensible, embodiments accompanying figures are described in details below.

BRIEF DESCRIPTION OF THE DRAWINGS

The accompanying drawings are included to provide further understanding and are incorporated in and constitute a part of this specification. The drawings illustrate exemplary embodiments and, together with the description, serve to explain the principles of the invention.

DESCRIPTION OF EMBODIMENTS

Figure 1:
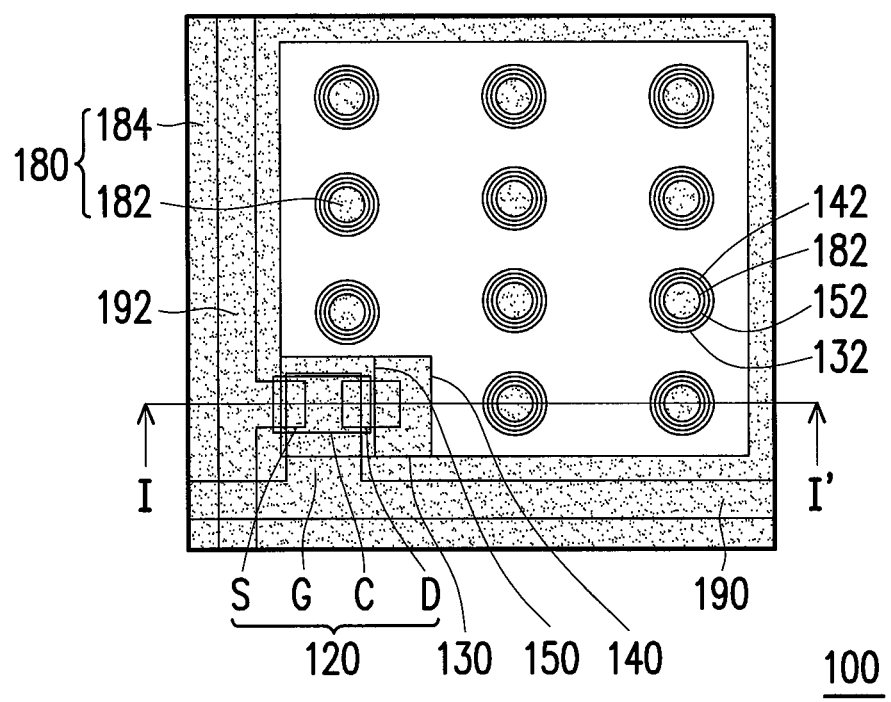
FIG. 1 is a schematic top view of a pixel structure according to an embodiment of the invention.
Figure 2:
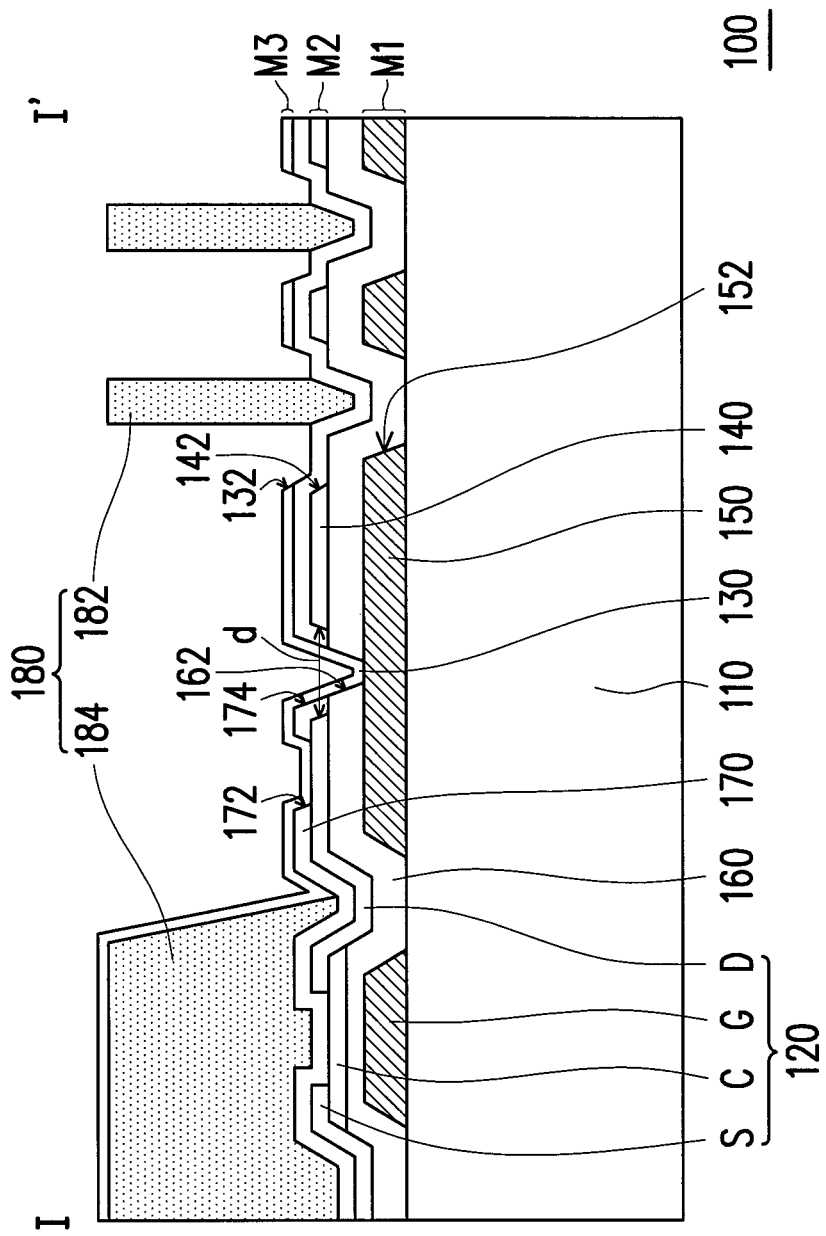
FIG. 2 is a schematic cross-sectional view of the pixel structure in FIG. 1 taken along line I-I'.

FIG. 1 is a schematic top view of a pixel structure according to an embodiment of the invention, and FIG. 2 is a schematic cross-sectional view of the pixel structure in FIG. 1 taken along line I-I'. Referring to FIGS. 1 and 2, a pixel structure 100 includes a flexible substrate 110, an active device 120, a pixel electrode 130, a capacitance electrode 140, an auxiliary electrode 150, a first insulation layer 160, a second insulation layer 170, and a padding layer 180. The active device 120, the pixel electrode 130, the capacitance electrode 140, the auxiliary electrode 150, the first insulation layer 160, the second insulation layer 170 and the padding layer 180 are all disposed on the flexible substrate 110. The first insulation layer 160 is disposed between the pixel electrode 130 and the flexible substrate 110. The second insulation layer 170 is disposed between the pixel electrode 130 and the capacitance electrode 140. In addition, the padding layer 180 is disposed on the flexible substrate 110 and includes a plurality of padding pillars 182 and a padding pattern 184.

In the present embodiment, the flexible substrate 110 is further disposed with a scan line 190 and a data line 192 to drive the active device 120. In detail, the active device 120 is disposed between the second insulation layer 170 and the flexible substrate 110 and includes a gate G, a channel layer C, a source S and a drain D. The channel layer C is located above the gate G, and the first insulation layer 160 is located between the gate G and the channel layer C. The source S and the drain D are connected to the channel layer C. The gate G is connected to the scan line 190. The source S is connected to the data line 192. The pixel electrode 130 is connected to the drain D. In other words, herein, the active device 120 is, but not limited to, a thin film transistor.

The auxiliary electrode 150, the capacitance electrode 140 and the pixel electrode 130 sequentially stack on one another. The auxiliary electrode 150 is disposed between the pixel electrode 130 and the flexible substrate 110. The capacitance electrode 140 is located between the pixel electrode 130 and the auxiliary electrode 150. In terms of electrical connection relations, the pixel electrode 130 is electrically connected to the active device 120 and to the auxiliary electrode 150.

In order to realize the connection relations of the pixel electrode 130 with other elements, the second insulation layer 170 has contact windows 172 and 174, and the first insulation layer 160 has a contact window 162. Herein, the contact window 172 exposes the drain D of the active device 120. The contact window 162 and the contact window 174 correspond to each other and expose the auxiliary electrode 150. Therefore, the pixel electrode 130 may be physically connected to the drain D through the contact window 172 and be conducted with the drain D; additionally, the pixel electrode 130 may also be physically connected to the auxiliary electrode 150 through the contact windows 162 and 174 and be conducted with the auxiliary electrode 150.

In addition, the capacitance electrode 140 and the pixel electrode 130 are not physically connected but are coupled to each other, and the capacitance electrode 140 and the auxiliary electrode 150 are physically disconnected but are also coupled to each other. In the present embodiment, the design in which the capacitance electrode 140 is coupled to the pixel electrode 130 and the auxiliary electrode 150 forms a storage capacitance structure. An area of the capacitance electrode 140 overlapping the pixel electrode 130 and the auxiliary electrode 150 determines a value of the storage capacitance. Specifically, outlines of the capacitance electrode 140 and the auxiliary electrode 150 roughly correspond to an outline of the pixel electrode 130 so as to increase the storage capacitance and maintain display stability of the pixel structure 100.

However, the invention is not limited to the above. In other embodiments, when a storage capacitance structure formed by the pixel electrode 130 and the capacitance electrode 140 has a sufficient capacitance, the auxiliary electrode 150 may be omitted to simplify and slim the overall structural design. In other words, the pixel structure 100 of the present embodiment is simply illustrated with a design having the auxiliary electrode 150, but the invention is not limited to the pixel structure 100 which has to be disposed with the auxiliary electrode 150 electrically connected to the pixel electrode 130.

In terms of the stacking sequence of the conductor components, the scan line 190, the gate G and the auxiliary electrode 150 may be formed by the same conductor layer, which is called a first conductor layer M1 herein. The data line 192, the source S, the drain D and the capacitance electrode 140 may be formed by the same conductor layer, which is called a second conductor layer M2 herein. The pixel electrode 130 is formed by another conductor layer, which is called a third conductor layer M3 herein. In the pixel structure 100 of the present embodiment, the stacking sequence of the layers is the first conductor layer M1, the first insulation layer 160, the second conductor layer M2, the second insulation layer 170, the padding layer 180 and the third conductor layer M3 sequentially.

Figure 3:
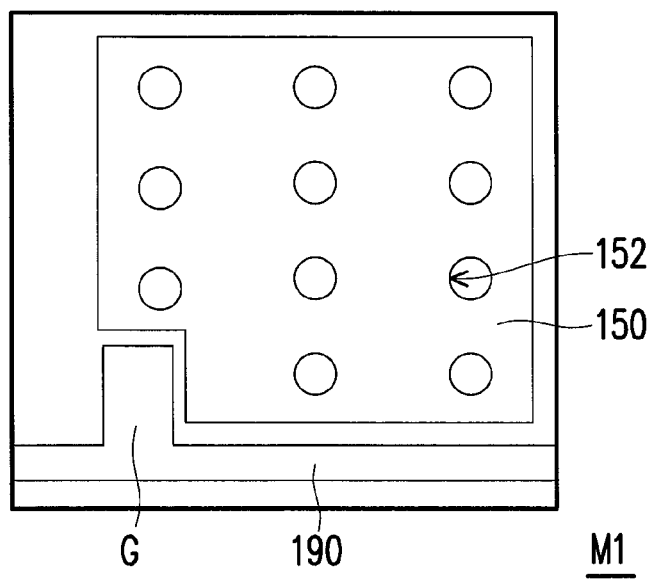
FIGS. 3 to 8 are schematic top views depicting a plurality of layers in the pixel structure in FIG. 1.

In order to show patterns of each layer clearly, FIGS. 3 to 8 are schematic top views depicting each of the layers in the pixel structure in FIG. 1. Referring to FIGS. 1, 2 and 3 first, the first conductor layer M1 is located between the first insulation layer 160 and the flexible substrate 110 and includes the scan line 190, the gate G and the auxiliary electrode 150. The scan line 190 and the gate G are physically connected and electrically connected to each other. In addition, the auxiliary electrode 150 is physically connected to neither the scan line 190 nor the gate G. Therefore, the auxiliary electrode 150 is electrically insulated from the scan line 190 and the gate G. In the present embodiment, the auxiliary electrode 150 has a plurality of auxiliary electrode openings 152 distributed within an area of the auxiliary electrode 150.

Figure 4:
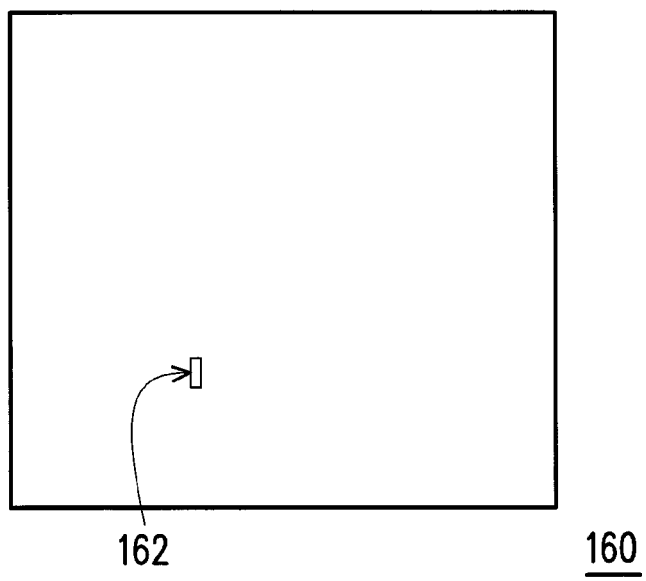

Then, referring to FIGS. 1, 2 and 4, the first insulation layer 160 substantially covers the first conductor layer M1 and has the contact window 162, wherein the contact window 162 exposes the auxiliary electrode 150.

Figure 5:
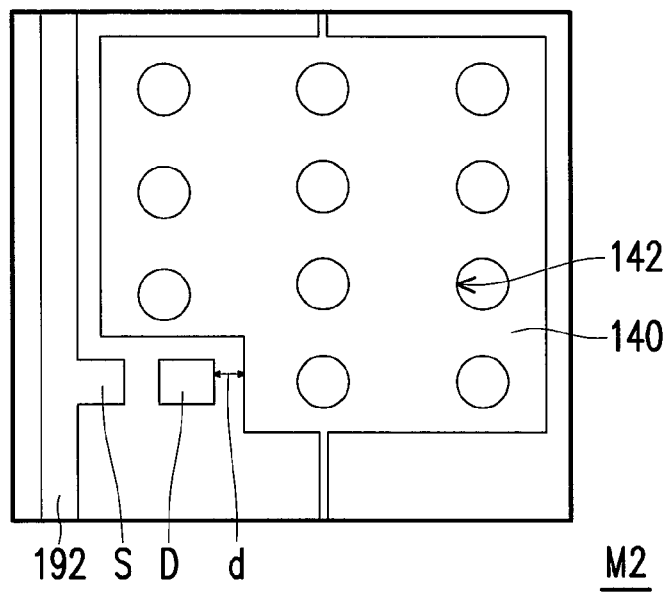

According to FIGS. 1, 2 and 5, the second conductor layer M2 is located between the first insulation layer 160 and the second insulation layer 170 and includes the data line 192, the source S, the drain D and the capacitance electrode 140. The source S is physically connected to the data line 192. Herein, the source S and the drain D are two conductor patterns separated from each other. In FIG. 2, the source S and the drain D are correspondingly connected to the channel layer C located above the gate G. The capacitance electrode 140 is not physically connected to the data line 192, the source S and the drain D and therefore is electrically insulated from the data line 192, the source S and the drain D. In the present embodiment, the capacitance electrode 140 and the drain D are separated by a distance d, so that the contact window 162 in the first insulation layer 160 is located in a region defined by the distance d. In this way, a portion of the area of the auxiliary electrode 150 does not overlap the capacitance electrode 140 and is exposed by the contact window 162. In addition, the capacitance electrode 140 has a plurality of capacitance electrode openings 142 corresponding to the auxiliary electrode openings 152.

Figure 6:
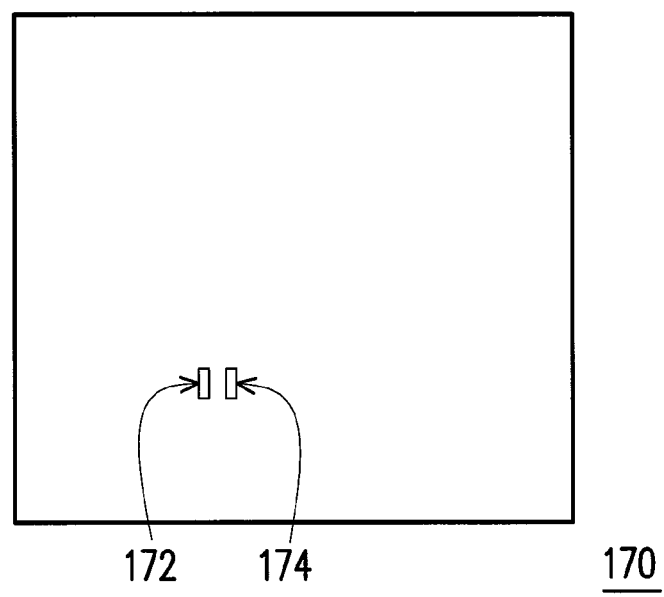

In FIGS. 1, 2 and 6, the second insulation layer 170 has the contact windows 172 and 174. The location of the contact window 172 corresponds to the drain D in the second conductor layer M2. The contact window 174 corresponds to the contact window 162 of the first insulation layer 160. Therefore, the contact window 174 and the contact window 162 expose the auxiliary electrode 150 together.

Figure 7:
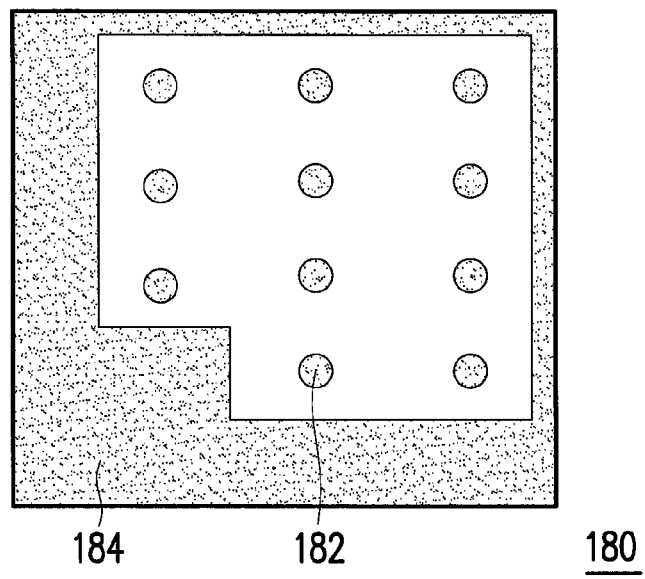

In FIGS. 1, 2 and 7, the padding layer 180 includes a plurality of padding pillars 182 and a padding pattern 184. The padding pattern 184 surrounds edges of the pixel structure 100 and covers the active device 120, and the padding pillars 182 are located in an area encircled by the padding layer 180. Specifically, the padding pillars 182 are respectively located in the capacitance electrode openings 142 and the auxiliary electrode openings 152. Therefore, there are substantially only the first insulation layer 160 and the second insulation layer 170 interposed between the padding pillars 182 and the flexible substrate 110 while no any conductor electrode is presented therebetween.

Figure 8:
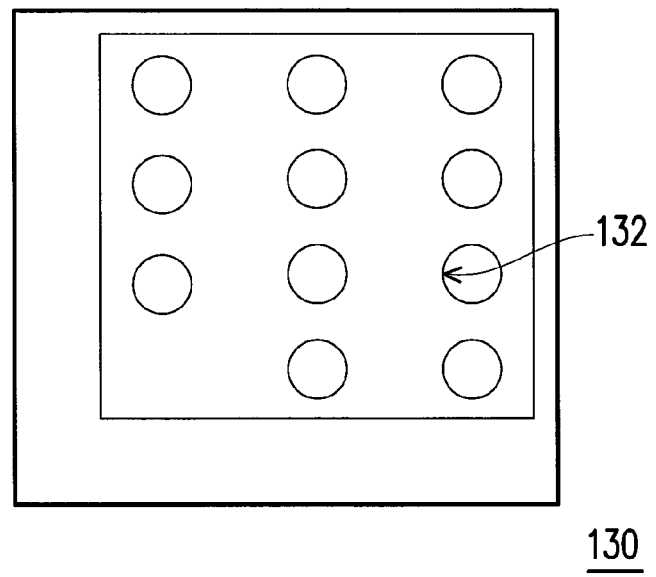

In FIGS. 1, 2 and 8, the pixel electrode 130 has a plurality of pixel electrode openings 132 that expose the padding pillars 182. Since the pixel electrode 130 is manufactured later than the padding layer 180, the pixel electrode 130 is partially disposed on the padding pattern 184. However, in the present embodiment, top portions of the padding pillars 182 are not covered by the pixel electrode 130. In other words, the top portions of the padding pillars 182 do not have any conductor material and are exposed by the pixel electrode 130.

In the present embodiment, since the pixel structure 100 has the padding pillars 182 that do not overlap the conductor electrodes, when the pixel structure 100 is under an external impact, the external force is applied on the padding pillars 182 first and more unlikely to be applied on the conductive structure. Therefore, the conductor components, such as the pixel electrode 130, the capacitance electrode 140 and the auxiliary electrode 150, in the pixel structure 100 are unlikely to be damaged due to the external impact, which helps to improve the reliability of the pixel structure 100. In addition, when the pixel structure 100 undergoes a drop ball test, a ratio of the pixel structure 100 passing the test also increases, which further improves the yield of the pixel structure 100.

Figure 9:
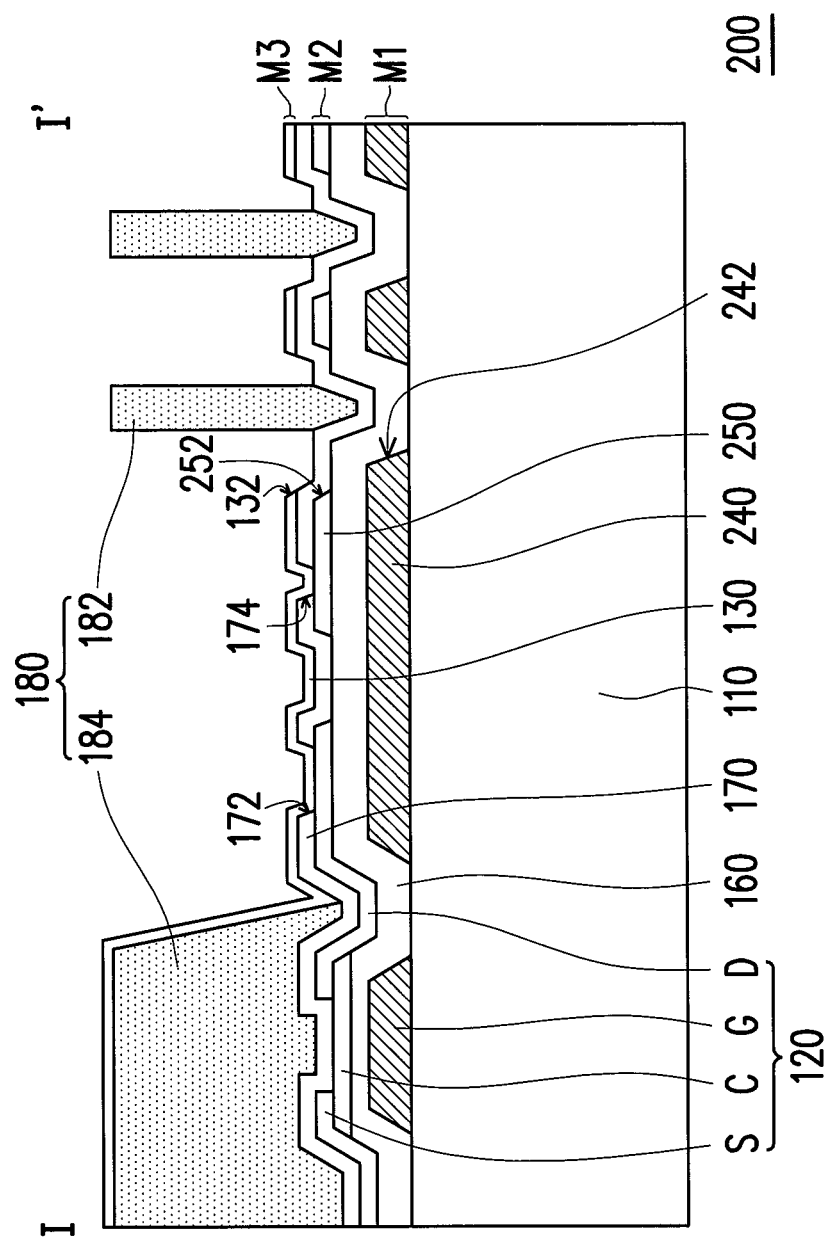
FIG. 9 is a schematic cross-sectional view of a pixel structure according to another embodiment of the invention.

In the previous embodiment, the disposition relation of the capacitance electrode 140 and the auxiliary electrode 150 is merely exemplary and is not for limiting the invention. For example, in an embodiment, the pixel structure 100 may omit the auxiliary electrode 150. In addition, in other embodiments, the stacking relation of the capacitance electrode 140 and the auxiliary electrode 150 may be exchanged. FIG. 9 is a schematic cross-sectional view of a pixel structure according to another embodiment of the invention. Referring to FIG. 9, a pixel structure 200 is substantially similar to the pixel structure 100, and the same components in the two are denoted by the same reference numbers and are not described in detail. Specifically, the present embodiment is different from the previous embodiment in that a capacitance electrode 240 is disposed between the flexible substrate 110 and an auxiliary electrode 250. In addition, the auxiliary electrode 250 is located between the capacitance electrode 240 and the pixel electrode 130.

In the present embodiment, the capacitance electrode 240 is, for example, manufactured by the first conductor layer M1 as is the gate G of the active device 120; in other words, the capacitance electrode 240 is located between the first insulation layer 160 and the flexible substrate 110. In addition, the capacitance electrode 240 has a plurality of capacitance electrode openings 242 corresponding to the pixel electrode openings 132, and the padding pillars 182 are located in the capacitance electrode openings 242. The first insulation layer 160 is disposed between the capacitance electrode 240 and the auxiliary electrode 250. At this time, the capacitance electrode 240 is not electrically connected to the pixel electrode 130; therefore, the first insulation layer 160 may not be disposed with openings covered by the pixel electrode 130.

The auxiliary electrode 250, substantially identical to the source S and the drain D, is formed by the second conductor layer M2, and has a plurality of auxiliary electrode openings 252 corresponding to the pixel electrode openings 132, and the padding pillars 182 are located in the auxiliary electrode openings 252. In addition, the second insulation layer 170 is located between the pixel electrode 130 and the auxiliary electrode 250, so that the pixel electrode 130 is electrically connected to the auxiliary electrode 250 through the contact window 174 of the second insulation layer 170.

In the present embodiment, the padding pillars 182 are not stacked on the conductor electrodes, and the pixel electrode 130 is not disposed on top surfaces of the padding pillars 182. When the pixel structure 200 is under an external impact during the process of use or a drop ball test, external force is applied on the padding pillars first, and a probability that the conductor electrodes are impacted is reduced. Therefore, the pixel structure 200 is unlikely to be entirely disabled due to the external impact which may damage the conductor electrodes and therefore has an ideal reliability and an extended service life.

Based on the above, the pixel structure of the embodiments of the invention is disposed with the padding pillars which do not overlap the conductor electrodes. When the pixel structure is under an external impact, the padding pillars endure the force of the external impact first and reduce the possibility of the other components being damaged due to the external impact. Therefore, the pixel structure of the embodiments of the invention has an ideal impact resistance, reliability and service life.

Although the invention has been described with reference to the above embodiments, they are not intended to limit the invention. It is apparent to people of ordinary skill in the art that modifications and variations to the invention may be made without departing from the spirit and scope of the invention. In view of the foregoing, the protection scope of the invention will be defined by the appended claims.

What is claimed is:

1. A pixel structure, comprising:
    a flexible substrate;
    an active device disposed on the flexible substrate;
    a pixel electrode disposed on the flexible substrate and electrically connected to the active device, wherein the pixel electrode has a plurality of pixel electrode openings;
    a capacitance electrode disposed on the flexible substrate and overlapping the pixel electrode, wherein the capacitance electrode has a plurality of capacitance electrode openings corresponding to the pixel electrode openings;
    a first insulation layer disposed between the pixel electrode and the flexible substrate;
    a second insulation layer disposed between the pixel electrode and the capacitance electrode, wherein the active device is disposed between the second insulation layer and the flexible substrate; and
    a padding layer disposed on the flexible substrate and comprising a plurality of padding pillars and a padding pattern, wherein the padding pattern covers the active device, the padding pillars are located in the pixel electrode openings respectively, and the pixel electrode partially covers the padding pattern and exposes the padding pillars.

2. The pixel structure according to claim 1, further comprising an auxiliary electrode disposed between the flexible substrate and the pixel electrode and electrically connected to the pixel electrode, wherein the auxiliary electrode has a plurality of auxiliary electrode openings corresponding to the pixel electrode openings and the capacitance electrode openings.

3. The pixel structure according to claim 2, wherein the capacitance electrode is located between the auxiliary electrode and the pixel electrode, and the first insulation layer is located between the auxiliary electrode and the capacitance electrode.

4. The pixel structure according to claim 3, wherein the first insulation layer has a first contact opening, the second insulation layer has a second contact opening, the first contact opening corresponds to the second contact opening, and the pixel electrode is connected to the auxiliary electrode through the first contact opening and the second contact opening.

5. The pixel structure according to claim 2, wherein the auxiliary electrode is located between the capacitance electrode and the pixel electrode, and the first insulation layer is located between the auxiliary electrode and the capacitance electrode.

6. The pixel structure according to claim 1, wherein the second insulation layer has a contact opening, so that the pixel electrode is electrically connected to the active device through the contact opening.

7. The pixel structure according to claim 1, wherein the first insulation layer and the second insulation layer are located between the padding pillars and the flexible substrate.

8. The pixel structure according to claim 1, wherein the padding pattern surrounds the pixel electrode.

9. The pixel structure according to claim 1, wherein the active device comprises a gate, a channel layer, a source and a drain, the channel layer is electrically insulated from the gate, the source and the drain are connected to the channel layer, the gate is connected to a scan line, the source is connected to a data line, and the drain is connected to the pixel electrode.

10. The pixel structure according to claim 9, wherein the source, the drain and the capacitance electrode are all disposed between the first insulation layer and the second insulation layer.

11. The pixel structure according to claim 9, wherein the gate is disposed between the first insulation layer and the flexible substrate.

12. The pixel structure according to claim 1, wherein the capacitance electrode is located between the first insulation layer and the flexible substrate.

* * * * *